United States Patent
Okada et al.

(10) Patent No.: US 9,117,656 B2
(45) Date of Patent: Aug. 25, 2015

(54) SEMICONDUCTOR CLEANING DEVICE AND SEMICONDUCTOR CLEANING METHOD

(75) Inventors: Akira Okada, Chiyoda-ku (JP); Takaya Noguchi, Chiyoda-ku (JP); Hajime Akiyama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 435 days.

(21) Appl. No.: 13/595,299

(22) Filed: Aug. 27, 2012

(65) Prior Publication Data

US 2013/0152965 A1    Jun. 20, 2013

(30) Foreign Application Priority Data

Dec. 19, 2011    (JP) .................................. 2011-276952

(51) Int. Cl.
*H01L 21/30*    (2006.01)
*B08B 6/00*    (2006.01)
(Continued)

(52) U.S. Cl.
CPC ............ *H01L 21/02076* (2013.01); *B08B 5/04* (2013.01); *B08B 6/00* (2013.01); *H01L 21/02041* (2013.01); *H01L 21/02046* (2013.01);
(Continued)

(58) Field of Classification Search
CPC .................. H01L 21/02076; H01L 21/02041; H01L 21/02046; H01L 21/02087; H01L 21/0209; H01L 21/67333; H01L 21/67028; H01L 21/67; H01L 21/673; B08B 6/00; B08B 7/00; B08B 7/04; B08B 5/00; B08B 5/04; B08B 11/00; B08B 11/02
USPC ...................... 15/1.51, 301, 303; 134/1.3, 902
See application file for complete search history.

(56) References Cited

U.S. PATENT DOCUMENTS

| 4,812,662 A | 3/1989 | Goto et al. |
| 5,102,496 A | 4/1992 | Savas |

(Continued)

FOREIGN PATENT DOCUMENTS

| CN | 101606233 A | 12/2009 |
| CN | 102097292 A | 6/2011 |

(Continued)

OTHER PUBLICATIONS

Office Action issued Mar. 11, 2014 in Japanese Patent Application No. 2011-276952 with English language translation.

(Continued)

*Primary Examiner* — Mark Spisich
(74) *Attorney, Agent, or Firm* — Oblon, McClelland, Maier & Neustadt, L.L.P.

(57) ABSTRACT

A semiconductor cleaning device includes an external electrode opposed to a side surface of the semiconductor device; a base configured to allow arrangement of the semiconductor device, and having an opening positioned between the side surface of the semiconductor device in the arranged state and the external electrode, and located below the side surface of the semiconductor device; a frame having an electrically insulating property, being in contact with the external electrode, arranged on the base and opposed to the side surface of the semiconductor device; and suction means connected to the opening in the base and being capable of taking in the foreign matter through the opening. Thereby, the semiconductor cleaning device and a semiconductor cleaning method that can remove the foreign matter adhered to the side surface of the semiconductor device and can prevent re-adhesion of the removed foreign matter can be obtained.

22 Claims, 5 Drawing Sheets

(51) Int. Cl.
*B08B 5/04* (2006.01)
*H01L 21/00* (2006.01)
*H01L 21/02* (2006.01)
*H01L 21/67* (2006.01)
*H01L 21/673* (2006.01)

(52) U.S. Cl.
CPC .............. *H01L 21/67* (2013.01); *H01L 21/673* (2013.01); *H01L 21/67028* (2013.01); *H01L 21/67333* (2013.01)

(56) References Cited

U.S. PATENT DOCUMENTS

| | | |
|---|---|---|
| 5,584,938 A | 12/1996 | Douglas |
| 5,619,145 A | 4/1997 | Matsuda |
| 2001/0030144 A1 | 10/2001 | Nemoto et al. |
| 2005/0147488 A1 | 7/2005 | Matsubara et al. |
| 2008/0190448 A1 | 8/2008 | Kim et al. |
| 2009/0176333 A1 | 7/2009 | Matsubara et al. |
| 2011/0108056 A1 | 5/2011 | Ishizawa et al. |

FOREIGN PATENT DOCUMENTS

| | | |
|---|---|---|
| JP | 01-213181 | 8/1989 |
| JP | 3-153885 A | 7/1991 |
| JP | 04-107948 | 4/1992 |
| JP | 04-115544 | 4/1992 |
| JP | 07-098361 | 4/1995 |
| JP | 07-099234 | 4/1995 |
| JP | 9-306882 A | 11/1997 |
| JP | 11-087457 | 3/1999 |
| JP | 2001-298080 A | 10/2001 |
| JP | 2002-362679 A | 12/2002 |
| JP | 2003-190894 A | 7/2003 |
| JP | 2004-172395 | 6/2004 |
| JP | 2004-186373 | 7/2004 |
| JP | 2005-197628 | 7/2005 |
| JP | 2010-109386 A | 5/2010 |
| JP | 2011-099156 | 5/2011 |

OTHER PUBLICATIONS

Combined Chinese Office Action and Search Report issued Jun. 3, 2014, in Chinese Patent Application No. 201210485793.1 with partial English translation and English translation of category of cited documents.

SEMICONDUCTOR CLEANING DEVICE AND SEMICONDUCTOR CLEANING METHOD

BACKGROUND OF THE INVENTION

1. Field of the Invention

The present invention relates to a semiconductor cleaning device and a semiconductor cleaning method, and particularly to a semiconductor cleaning device and a semiconductor cleaning method for removing foreign matter from a semiconductor device.

2. Description of the Background Art

Semiconductor devices are manufactured through a multiple kinds of processing performed on a semiconductor wafer that is an aggregate of semiconductor devices. In the processing of manufacturing the semiconductor devices, entry of foreign matter occurs in various steps to cause disadvantages in the semiconductor devices. This deteriorates a yield of the semiconductor devices. Therefore, it is desired to remove the foreign matter from the semiconductor devices.

For example, Japanese Patent Laying-Open Nos. 11-087457 and 2011-099156 have proposed devices that can remove foreign matter in a manufacturing process of semiconductor devices. The device disclosed in the above Japanese Patent Laying-Open No. 11-087457 has an electrostatically attracting and transporting arm as well as a plate member for removing foreign matter. From a portion of the electrostatically attracting and transporting arm that is in contact with a rear surface of a wafer, foreign matter is transferred onto the plate member and thereby is removed. Further, the device disclosed in the above Japanese Patent Laying-Open No. 2011-099156 has a transporting arm provided with an electrostatic chuck. A voltage of the same polarity as electric charges of foreign matter adhered to the transporting arm is applied to an electrode of the electrostatic chuck, and a nitrogen gas is blown against the transporting arm to remove the foreign matter.

However, in the device disclosed in the above Japanese Patent Laying-Open No. 11-087457, since the foreign matter is transferred onto the plate member from the portion of the electrostatically attracting and transporting arm that is in contact with the rear surface of the wafer, it is impossible to remove the foreign matter adhered to a side surface of the semiconductor wafer. In the device disclosed in the above Japanese Patent Laying-Open No. 2011-099156, since the electrostatic chuck attracts the rear surface of the semiconductor wafer, it is difficult to remove the foreign matter adhered to a side surface of the semiconductor wafer. Further, the gas is blown for removing the foreign matter so that the foreign matter scattered by the blown gas may adhere again without being removed.

Each of the semiconductor devices which produced by dividing the semiconductor wafer by dicing or the like may suffer from a problem due to presence of the foreign matter in test steps such as evaluation of electric characteristics after the manufacturing steps. For example, when foreign matter adheres to the surface of the semiconductor device provided with a pad for electric connection, it may cause short-circuiting and discharging. These cause disadvantages in the semiconductor device.

In a semiconductor device of a vertical structure that flows a current in a vertical direction, i.e., an out-of-plane direction of the semiconductor device, since not only a front-surface side but also a rear-surface side is used as an electrode, adhesion of foreign matter to the rear surface deteriorates a close-contact property between the semiconductor device and the external electrode. The deterioration in close-contact property between the semiconductor device and the external electrode affects a contact resistance and consequently affects electric properties. In a contact portion where the semiconductor device is in contact with the foreign matter as well as the vicinity thereof, the presence of the foreign matter may cause a defect such as a crack, and thereby may partially break the semiconductor device.

In connection with the foreign matter of individual semiconductor devices, such a fact has been known that, in a process of dividing the semiconductor wafer into semiconductor devices, a large number of minute pieces, scraps and the like of the semiconductor wafer material occur from the side surfaces of the semiconductor devices, and these minute pieces and the like acting as the foreign matter will stay on the side surface of each semiconductor device or the vicinity thereof, and will be brought into a later test step. This kind of foreign matter may move to the front and rear surfaces of the semiconductor device.

SUMMARY OF THE INVENTION

The present invention has been made in view of the above problems, and an abject thereof is to provide a semiconductor cleaning device and a semiconductor cleaning method that can remove foreign matter adhered to a side surface of a semiconductor device, and can prevent re-adhesion of the removed foreign matter.

A semiconductor cleaning device according to the invention is a device for removing foreign matter from a semiconductor device, and includes an external electrode opposed to a side surface of the semiconductor device; a base configured to allow arrangement of the semiconductor device, and having an opening positioned between the side surface of the semiconductor device in the arranged state and the external electrode, and located below the side surface of the semiconductor device; a frame having an electrically insulating property, being in contact with the external electrode, arranged on the base and opposed to the side surface of the semiconductor device; and suction means connected to the opening in the base and being capable of taking in the foreign matter through the opening.

According to the semiconductor cleaning device of the invention, since the external electrode is opposed to the side surface of the semiconductor device, the external electrode can remove the foreign matter adhered to the side surface of the semiconductor device from the side surface. Since the suction means can take in the foreign matter through the opening arranged below the side surface of the semiconductor device, it is possible to prevent re-adhesion of the foreign matter that was removed from the side surface of the semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

First Embodiment

First, a structure of a semiconductor cleaning device of a first embodiment of the invention will be described.

Figure 1:
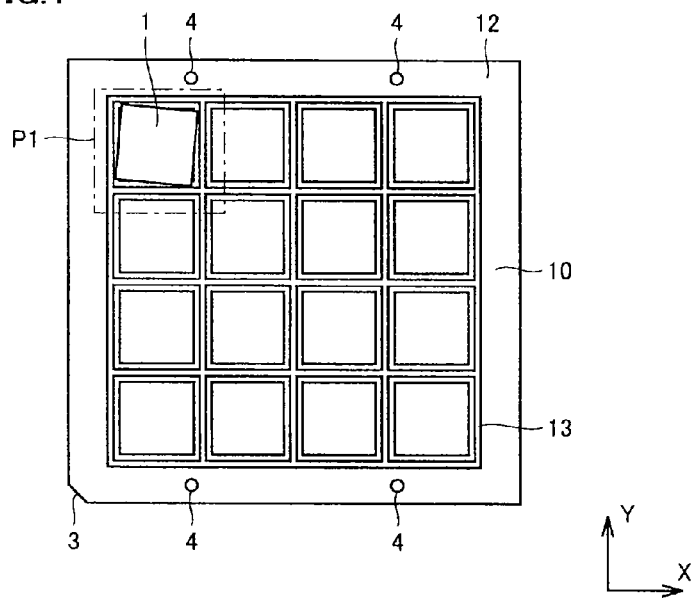
FIG. 1 is a schematic plan of a semiconductor cleaning device in a first embodiment of the invention.
Figure 2:
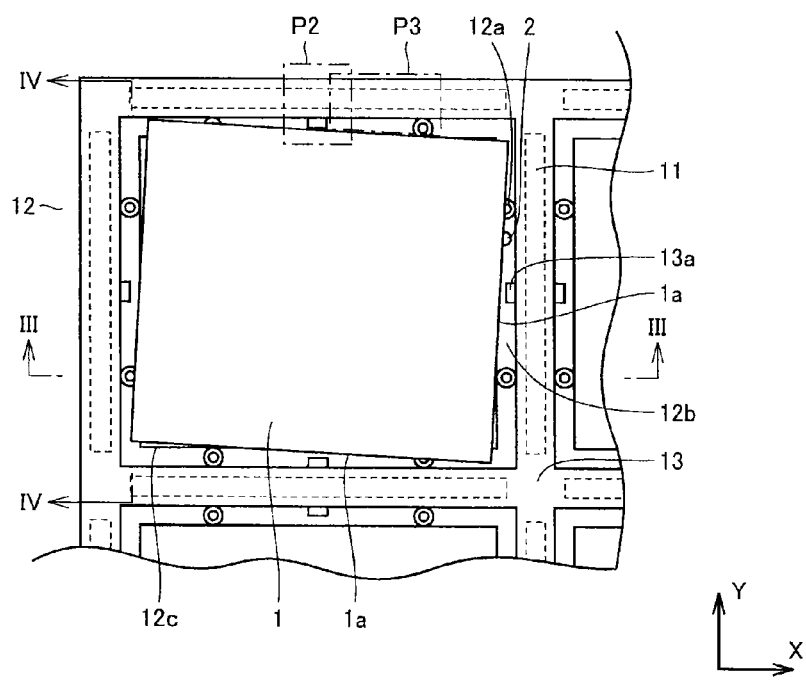
FIG. 2 is a schematic plan showing, on an enlarged scale, a portion P1 in FIG. 1.
Figure 3:
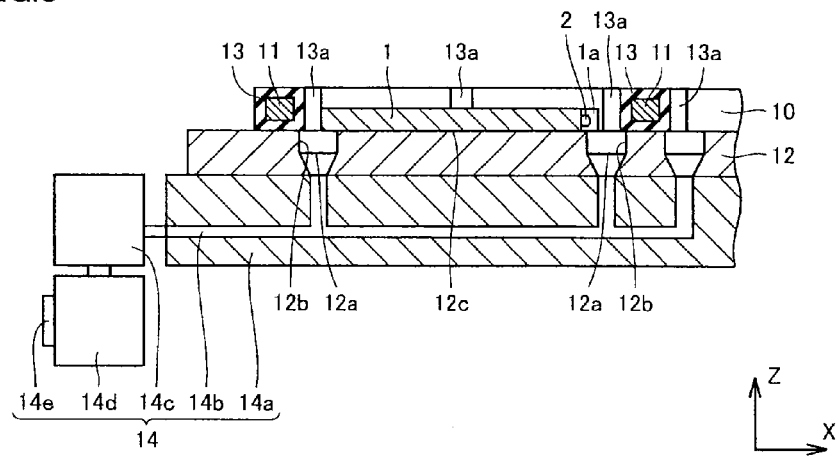
FIG. 3 is a schematic cross section taken along line III-III in FIG. 2.
Figure 4:
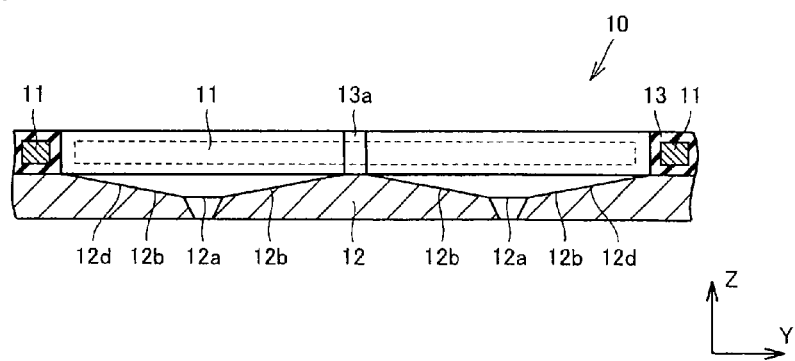
FIG. 4 is a schematic cross section taken along line IV-IV in FIG. 3.

Referring to FIGS. 1 to 4, the semiconductor cleaning device of the embodiment is a device for removing foreign matter 2 from semiconductor devices 1. In FIGS. 1 to 3, semiconductor devices 1 are arranged on the semiconductor cleaning device. For the sake of clarification, FIG. 1 shows only one semiconductor device 1. FIGS. 1 and 2 do not show suction means for the sake of illustration. FIG. 2 shows a portion where one semiconductor device 1 is arranged. FIG. 4 does not show the suction means for the sake of clarification.

Semiconductor device 1 is, e.g., a semiconductor chip formed of a silicon substrate that is prepared by dicing a silicon wafer. Foreign matter 2 is small silicon pieces and silicon scraps that are present on a side surface 1a of semiconductor device 1.

The semiconductor cleaning device primarily includes an external electrode 11, a base 12, a frame 13 and suction means 14. Base 12 and frame 13 form a semiconductor test jig 10. Semiconductor test jig 10 is a test jig that is primarily used when electric characteristics of semiconductor device 1 are to be measured. Also, semiconductor test jig 10 can be used for transporting semiconductor devices 1. Thus, semiconductor test jig 10 can be used for transporting semiconductor devices 1 to a device used for measuring the electric characteristics after cleaning.

Semiconductor test jig 10 has first positioning means 3 and second positioning means 4. First and second positioning means 3 and 4 fix the position of semiconductor device 1 arranged on semiconductor test jig 10 with respect to the cleaning device removing the foreign matter and a test device measuring the electric characteristics. First positioning means 3 is formed of an oblique side formed on one of corners of base 12. First positioning means 3 enables determination of up-and-down and left-and-right directions of semiconductor test jig 10. Second positioning means 4 is formed of a plurality of apertures formed in one side of base 12 and another side opposed to the one side. The plurality of apertures of second positioning means 4 are fitted to convex portions formed on suction means 14 so that semiconductor test jig 10 is positioned.

External electrode 11 is opposed to side surface 1a of semiconductor device 1. Side surface 1a of semiconductor device 1 intersects a bottom surface of semiconductor device 1 opposed to base 12. Foreign matter 2 adhered to side surface 1a of semiconductor device 1 has been charged due to friction, contact or the like. External electrode 11 is configured to isolate and remove foreign matter 2 that is positively or negatively charged from side surface 1a of semiconductor device 1 by electrostatic attraction.

External electrode 11 may be arranged inside frame 13. In this case, external electrode 11 is covered with frame 13. For example, when a positive voltage is applied to external electrode 11, a front-surface side of frame 13 becomes negative to attract foreign matter 2 that is positively charged, although electric wiring is not shown in the figure. Conversely, when external electrode 11 is supplied with a negative voltage, the front-surface side of frame 13 becomes positive to attract foreign matter 2 that is negatively charged.

Base 12 is configured to allow arrangement of semiconductor device 1 thereon. Base 12 has openings 12a each of which is formed below side surface 1a of semiconductor device 1 arranged thereon and particularly in a position between side surface 1a of semiconductor device 1 and external electrode 11. Opening 12a extends through base 12 and opens on its front and rear surfaces.

Base 12 may be electrically conductive. Thereby, base 12 can be used as an electrode to allow evaluation of semiconductor device 1 having a vertical structure. Base 12 is made of, e.g., metal. Specifically, it may be formed of a plate-like aluminum member. For evaluating semiconductor device 1 of a lateral structure that is provided at only its front surface with an electrode pad, base 12 may not be electrically conductive.

Base 12 may be configured to allow arrangement of the plurality of semiconductor devices 1. In this embodiment, base 12 is configured to allow arrangement of, e.g., 16 semiconductor devices 1. Base 12 may have grooves 12b. Groove 12b is formed below side surface 1a of semiconductor device 1 and continues to opening 12a at a surface on which semiconductor device 1 is arranged.

Base 12 has arranging portions 12c that are surface portions supporting semiconductor devices 1, respectively, and are surrounded by groove 12b. Arranging portion 12c is smaller in area than semiconductor device 1. For preventing damages to the arrangement surface of semiconductor device 1, it is desired to ensure a flat plane having no burr and projection through cleaning and polishing steps.

Groove 12b has an inclined structure having a height that decreases as the position moves toward opening 12a. A concavely inclined surface 12d forms this inclined structure. Each of first positioning means 3, second positioning means 4, opening 12a and groove 12b may be formed by machining base 12.

Frame 13 has an electrically insulating property. Frame 13 is arranged to prevent electrical conduction between semiconductor devices 1 neighboring to each other. Also, it is configured to suppress discharging of another neighboring semiconductor device 1. Frame 13 is made of an electrically insulative material such as PPS (PolyPhenylene Sulfide) resin.

Frame 13 is disposed on base 12 such that it is in contact with external electrode 11 and is opposed to side surface 1a of semiconductor device 1. Frame 13 has a convex form. Frame 13 may have a projected portion 13a projecting toward side surface 1a of semiconductor device 1. Contact of projected portion 13a with side surface 1a of semiconductor device 1 prevents contact of side surface 1a with the surface of frame 13.

Frame 13 may be arranged to surround side surface 1a of semiconductor device 1. Frame 13 may have a grid-like form surrounding each of the plurality of semiconductor devices. In this embodiment, semiconductor test jig 10 is configured to allow arrangement of 16 semiconductor devices 1. However, this is not restrictive, and the number of semiconductor devices 1 arranged thereon may be increased or decreased depending on a size of the test device and a size of the semiconductor device.

Suction means 14 is connected to opening 12a of base 12 and is capable of taking in foreign matter 2 through opening 12a. Suction means 14 may have a rotary fan. Suction means 14 may have a body 14a, a suction pipe 14b, a foreign matter removal filter 14c, a suction portion 14d and an exhaust port 14e. Suction pipe 14b is formed in body 14a. Suction pipe 14b is connected to openings 12a. Suction pipe 14b is connected to suction portion 14d via foreign matter removal filter 14c. Suction portion 14d is provided with exhaust port 14e. Suction portion 14d may be, e.g., a rotary fan.

Suction means 14 is configured such that suction portion 14d takes in the air through opening 12a and suction pipe 14b, and thereby takes in foreign matter 2 through opening 12a. Foreign matter removal filter 14c removes foreign matter 2 taken in through opening 12a. Exhaust port 14e discharges the air thus taken in.

Foreign matter 2 attracted onto frame 13 is discharged from the rear surface of semiconductor test jig 10 through opening 12a. By discharging foreign matter 2 from the rear surface, re-adhesion of foreign matter 2 is prevented even when semiconductor device 1 is left on arranging portion 12c. Therefore, foreign matter 2 is efficiently removed without increasing a step for moving semiconductor device 1.

A semiconductor cleaning method using the semiconductor cleaning device of the embodiment will be described below.

First, semiconductor device 1 is arranged on base 12 of semiconductor test jig 10. More specifically, semiconductor device 1 is arranged such that an arrangement surface of semiconductor device 1 is in contact with arranging portion 12c of base 12. When it is arranged, a part of foreign matter 2 adhered to side surface 1a of semiconductor device 1 and the vicinity of side surface 1a falls into openings 12a or grooves 12b formed below side surface 1a of semiconductor device 1. Thus, vibrations, shocks or the like that occur in the arranging operation cause foreign matter 2 adhered to side surface 1a or the vicinity of side surface 1a to fall into opening 12a or groove 12b formed below side surface 1a of semiconductor device 1.

Subsequently, e.g., a positive voltage is applied to external electrode 11 in the state where semiconductor device 1 is arranged. Owing to the electrostatic attraction by external electrode 11, foreign matter 2 that is positively charged due to friction, contact or the like is attracted onto frame 13 covering external electrode 11. It is merely required to apply a positive or negative voltage to external electrode 11, and a negative voltage may be applied thereto.

Then, suction means 14 starts suction to take in foreign matter 2 adhered to side surface 1a of semiconductor device 1 through opening 12a. In the state where the suction has started, an opposite voltage (negative voltage) is applied to external electrode 11. In this operation, suction means 14 takes in positively charged foreign matter 2 through opening 12a, and foreign matter 2 that is negatively charged due to the friction and/or contact is attracted to frame 13 covering external electrode 11 owing to the electrostatic attraction by external electrode 11.

Then, an opposite voltage (positive voltage) is applied to external electrode 11 while the suction is being continued. In this operation, suction means 14 takes in negatively charged foreign matter 2 through opening 12a. Thereby, foreign matter 2 is removed from semiconductor device 1. When suction means 14 ends the suction thereafter, the removal of foreign matter 2 ends.

Subsequently, modifications of the semiconductor cleaning device of the embodiment will be described.

Figure 5:
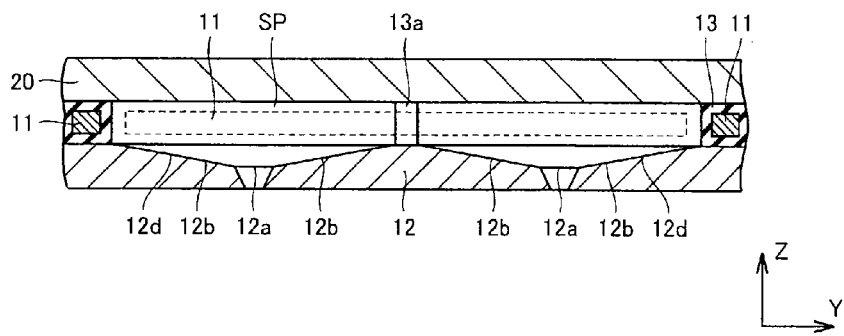
FIG. 5 is a schematic cross section of a modification example 1 of the semiconductor cleaning device in the first embodiment of the invention.

Referring to FIG. 5, suction means 14 may have a vacuum exhaust device as is done in a modification 1 of the semiconductor cleaning device of the embodiment. The vacuum exhaust device is, e.g., a vacuum pump. In this modification 1, a space SP defined and surrounded by base 12 and frame 13 for arranging semiconductor device 1 therein is covered by a cap 20 to form a closed region. This space SP undergoes the vacuum exhausting so that foreign matter 2 is taken in through opening 12a.

Figure 6:
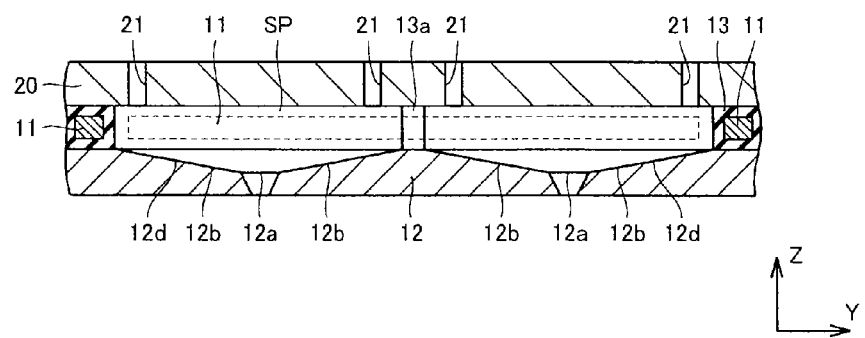
FIG. 6 is a schematic cross section of a modification example 2 of the semiconductor cleaning device in the first embodiment of the invention.

Referring to FIG. 6, cap 20 may have a plurality of through holes 21 connected to space SP, as is done in a modification 2 of the semiconductor cleaning device of the embodiment. In this modification 2, cap 20 covers an upper side of frame 13 so that an air flow is restricted during the suction and foreign matter 2 is effectively removed. More specifically, each through hole 21 is formed in a position that is not opposed in a Z direction in the figure to opening 12a, i.e., a position not overlapping it. The air flow is restricted to flow along inclined surface 12d so that foreign matter 2 fallen into groove 12b is effectively discharged. Therefore, foreign matter 2 is effectively removed through opening 12a.

Figure 7:
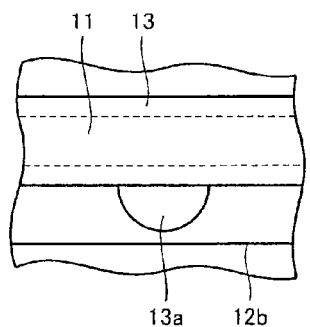
FIG. 7 is a schematic plan of a modification 3 of the semiconductor cleaning device in the first embodiment of the invention, and shows a portion corresponding to a portion P2 in FIG. 2.

Referring to FIG. 7, as is done in a modification 3 of the semiconductor cleaning device in the embodiment, the surface of projected portion 13a opposed to semiconductor device 1 may be curved into an arc-shaped form. In the modification 3, this structure can relieve the shock caused by contact between projected portion 13a and semiconductor device 1.

Figure 8:
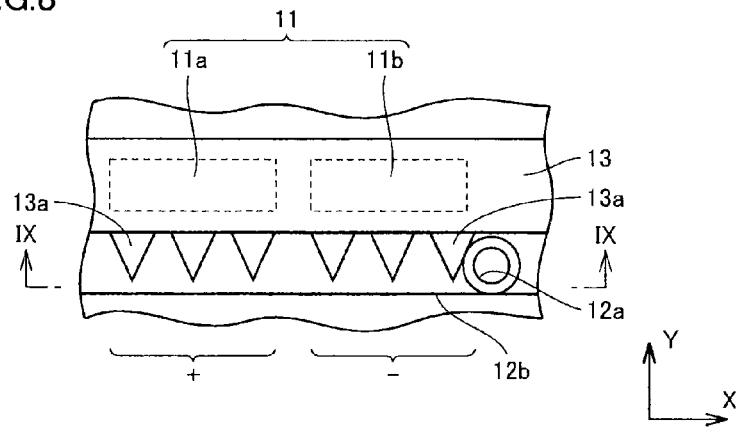
FIG. 8 is a schematic plan of a modification 4 of the semiconductor cleaning device in the first embodiment of the invention, and shows a portion corresponding to a portion P3 in FIG. 2.
Figure 9:
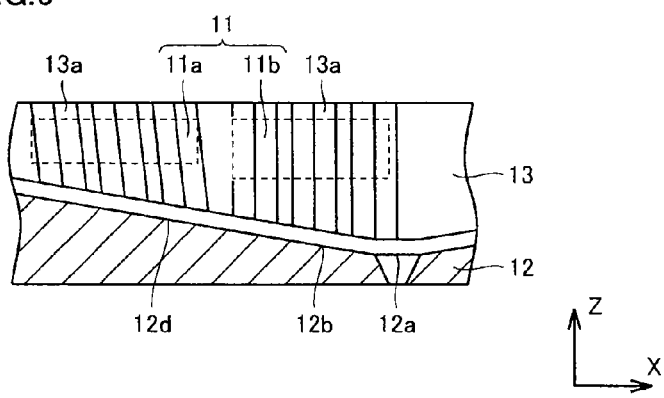
FIG. 9 is a schematic cross section taken along line IX-IX in FIG. 8.

Referring to FIGS. 8 and 9, projected portion 13a may have a needle-like tip end, as is done in a modification 5 of the semiconductor cleaning device of the embodiment. Projected portion 13a has a projection having an acute sectional form. The plurality of projected portions 13a may be formed. Projected portion 13a having a needle-like tip end (i.e., needle-like projected portion) reduces a distance to side surface 1a of semiconductor device 1. Further, electric charges concentrate on the tip end having the acute section so that a force of attracting charged foreign matter 2 increases.

External electrode 11 may have a plurality of external electrode members 11a and 11b. External electrode members 11a and 11b can apply different voltages (i.e., one and the other of positive and negative voltages), respectively. Since the plurality of external electrode members 11a and 11b are opposed to side surface 1a of semiconductor device 1, neighboring external electrode members 11a and 11b apply the voltages of different signs, respectively, so that foreign matter 2 that is charged positively and negatively charged to exhibit opposite signs can be attracted in a single voltage applying step.

As shown in FIG. 9, frame 13 may be formed to change its height according to the inclination structure of groove 12b.

Since the height of frame 13 changes along inclined surface 12d of the inclined structure of groove 12b, the air flow is restricted to flow along projected portion 13a so that foreign matter 2 fallen into groove 12b is effectively discharged.

Needle-like projected portion 13a remote from opening 12a may be inclined with respect to the Z-axis direction in the figure. This can effectively restrict the air flow to flow along projected portion 13a. It has been described that projected portion 13a having an acute section continues in the Z-axis direction in the figure. However, this is not restrictive, and a plurality of independent projected portions 13a may be configured to continue in the Z-axis direction in the figure.

Figure 10:
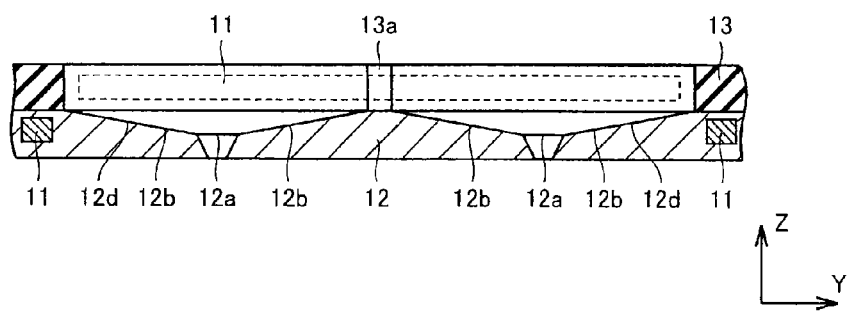
FIG. 10 is a schematic cross section of a modification 5 of the semiconductor cleaning device in the first embodiment of the invention.

Referring to FIG. 10, external electrode 11 may be arranged inside base 12, as is done in the modification 5 of the semiconductor cleaning device of the embodiment. In this case, since external electrode 11 is arranged inside base 12, external electrode 11 can be arranged easily.

Operations and effects of the invention will be described below.

According to the semiconductor cleaning device of the embodiment, since external electrode 11 is opposed to side surface 1a of semiconductor device 1, external electrode 11 can remove foreign matter 2 adhered to side surface 1a of semiconductor device 1 from side surface 1a. Since suction means 14 can take in foreign matter 2 through opening 12a formed below side surface 1a of semiconductor device 1, it is possible to prevent re-adhesion of foreign matter 2 that was removed from side surface 1a of semiconductor device 1.

According to the semiconductor cleaning device of the embodiment, since base 12 has electric conductivity, semiconductor device 1 of the vertical type can be evaluated using base 12 as the electrode.

According to the semiconductor cleaning device of the embodiment, since the frame has the projected portion projected toward the side surface of the semiconductor device, projected portion 13a can come into contact with side surface 1a of semiconductor device 1 and this can prevent the plane contact between side surface 1a and frame 13. If the plane contact were caused, foreign matter 2 would be pinched between side surface 1a of semiconductor device 1 and the plane of frame 13, and therefore it would be difficult to remove foreign matter 2 away from side surface 1a of semiconductor device 1. Therefore, it would be difficult to remove foreign matter 2. Since the semiconductor cleaning device of the embodiment can prevent the plane contact between side surface 1a and frame 13, foreign matter 2 can be removed easily.

According to the semiconductor cleaning device of the embodiment, since projected portion 13a has the needle-like tip end, the electric charges are concentrated on the tip end to increase a force of attracting charged foreign matter 2. Therefore, foreign matter 2 can be removed more effectively.

According to the semiconductor cleaning device of the embodiment, since frame 13 surrounds side surface 1a of semiconductor device 1, mutual conduction between the neighboring semiconductor devices 1 can be reliably prevented, and discharging of another neighboring semiconductor device 1 can be suppressed.

According to the semiconductor cleaning device of the embodiment, base 12 is arranged to allow arrangement of the plurality of semiconductor devices 1, and frame 13 is arranged in a grid-like form to surround independently each of the plurality of semiconductor devices 1 so that the device can clean up the plurality of semiconductor devices 1 at one time. Therefore, semiconductor devices 1 can be cleaned efficiently.

According to the semiconductor cleaning device of the embodiment, since external electrode 11 is arranged inside frame 13, the semiconductor cleaning device can be small in size. By locating external electrode 11 close to side surface 1a of semiconductor device 1, the force of attracting foreign matter 2 can be increased.

According to the semiconductor cleaning device of the embodiment, since external electrode 11 is arranged inside base 12, external electrode 11 can be arranged easily, which facilitates manufacturing of the semiconductor cleaning device.

According to the semiconductor cleaning device of the embodiment, since external electrode members 11a and 11b can apply different voltages (i.e., one and the other of positive and negative voltages), respectively, even when some and other kinds of foreign matter 2 are charged differently in sign, these kinds of foreign matter 2 that are charged in opposite (i.e., positive and negative) signs, respectively, can be attracted in the single voltage applying step. If external electrode 11 were one in number, two voltage applying steps would be required for applying the positive and negative voltages. According to the semiconductor cleaning device of the embodiment, however, the plurality of external electrode members 11a and 11b can apply the positive and negative voltages in the single voltage applying step so that the step can be half as compared with the case of the single external electrode 11, and therefore can be simple.

According to the semiconductor cleaning device of the embodiment, since base 12 has groove 12b that is connected to opening 12a and is formed below side surface 1a of semiconductor device 1, foreign matter 2 that occur on side surface 1a of semiconductor device 1 and the vicinity thereof can be collected into groove 12b. This can suppress the movement of foreign matter 2 that may affect the electric characteristics to arranging portion 12c as well as front and rear surfaces of semiconductor device 1.

According to the semiconductor cleaning device of the embodiment, since the area of arranging portion 12c is smaller than that of semiconductor device 1, it is possible to suppress adhesion of foreign matter 2 to arranging portion 12c.

According to the semiconductor cleaning device of the embodiment, since groove 12b has such an inclined structure that the height thereof decreases as the position moves toward opening 12a, foreign matter 2 can be easily taken into opening 12a.

According to the semiconductor cleaning device of the embodiment, since frame 13 has a height that changes according to the inclined structure of groove 12b, the air flow is restricted to follow projected portion 13a so that foreign matter 2 fallen into groove 12b can be effectively discharged.

Since the semiconductor cleaning device of the embodiment has cap 20 that covers space SP surrounded by base 12 and frame 13, foreign matter 2 can be effectively taken into opening 12a.

According to the semiconductor cleaning device of the embodiment, since cap 20 has a plurality of through holes 21 continuing to space SP, this structure restricts the air flow in the suction operation, and allows effective removal of foreign matter 2.

According to the semiconductor cleaning device of the embodiment, since suction means 14 has a rotary fan, the rotary fan can be used for taking in foreign matter 2.

According to the semiconductor cleaning device of the embodiment, since suction means 14 includes the vacuum exhaust device, the vacuum exhaust device can be used for taking in foreign matter 2.

Second Embodiment

A second embodiment of the invention is different from the first embodiment in that it includes charge erasing means.

Figure 11:
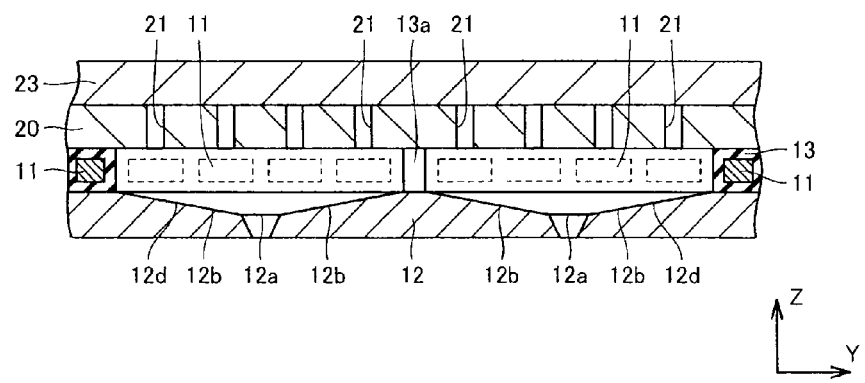
FIG. 11 is a schematic cross section of a semiconductor cleaning device in a second embodiment of the invention.

Referring to FIG. 11, a semiconductor cleaning device of the embodiment includes charge erasing means for erasing electrostatic charges on foreign matter 2 adhered to semiconductor device 1. The charge erasing means may have an ionizer 23. Ionizer 23 is arranged on a top surface of cap 20. Ionizer 23 is configured such that it can erase the charges on foreign matter 2 by supplying positive and negative ions to the vicinity of frame 13 through through holes 21 formed in cap 20. Since charge-erased foreign matter 2 can be easily separated from frame 13, separated foreign matter 2 can be easily taken into opening 12a by starting in advance the air suction. Ionizer 23 may be of a DC-type or AC-type. The AC-type ionizer can alternately produce positive and negative ions, and the DC-type ionizer can produce ions of a predetermined sign from a dedicated electrode. DC-ionizer 23 may be used, the positions of external electrodes 11 and through holes 21 may be aligned as shown in FIG. 11 and ions of a predetermined sign corresponding to the sign of attracted foreign matter 2 may be supplied, whereby the charge erasing can be performed effectively. This reduces the charge erasing time.

The semiconductor cleaning method using the semiconductor cleaning device of the embodiment will be described below.

First, semiconductor devices 1 are arranged on base 12 of semiconductor test jig 10. In this operation, a part of foreign matter 2 adhered to side surface 1a of semiconductor device 1 and the vicinity of side surface 1a falls into openings 12a formed below side surfaces 1a of semiconductor device 1 or grooves 12b.

Subsequently, in the state where semiconductor device 1 is arranged, the positive or negative voltage is applied to each of the plurality of external electrodes 11. Owing to the electrostatic attraction by the plurality of external electrodes 11, different kinds of foreign matter 2 that are positively and negatively charged due to friction, contact or the like, respectively, are attracted to frame 13 covering external electrodes 11.

Then, suction means 14 starts suction to take in foreign matter 2 adhered to side surface 1a of semiconductor device 1 through opening 12a. Ionizer 23 operates to supply ions. Thereby, charge-erased foreign matter 2 is separated from frame 13. Suction means 14 takes in foreign matter 2 separated from frame 13 through opening 12a. Thereby, foreign matter 2 is removed from semiconductor device 1. Thereafter, suction means 14 ends the suction and thereby the removal of foreign matter 2 ends.

The case where ionizer 23 is used as the charge erasing means has been described. However, this is not restrictive, and humidifying means or heating means may be employed as the charge erasing means. Further, a plurality of charge erasing means may be employed, whereby the charge erasing effect can be further increased.

Figure 12:
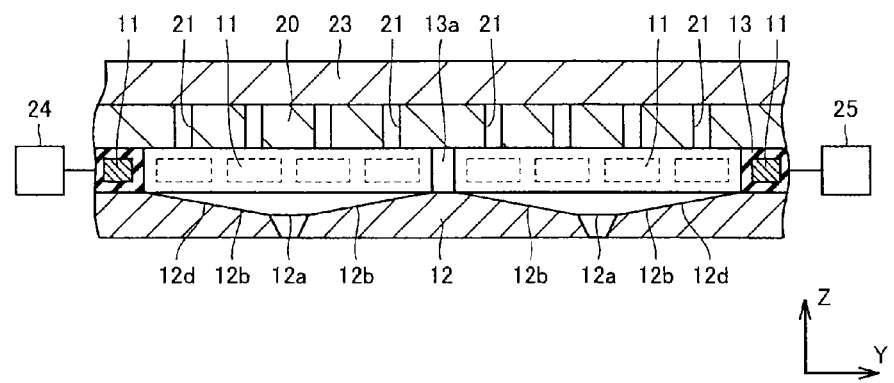
FIG. 12 is a schematic cross section of a modification of the semiconductor cleaning device in the second embodiment of the invention.

Referring to FIG. 12, a modification of the semiconductor cleaning device of the embodiment is provided with humidifying means 24 and heating means 25 as the charge erasing means. Humidifying means 24 is, e.g., a humidifier. Heating means 25 is, e.g., a heater.

The structures and the cleaning method of this embodiment other than the above are substantially the same as those of the first embodiment. Therefore, the same elements bear the same reference numbers, and description thereof is not repeated.

Since the semiconductor cleaning device of the embodiment has the charge erasing means for erasing the charges of foreign matter 2 adhered to semiconductor device 1, foreign matter 2 can be easily removed through opening 12a by erasing the charges even when foreign matter 2 carries the charges of different signs.

According to the semiconductor cleaning device of the embodiment, since the charge erasing means include ionizer 23, charges of foreign matter 2 can be erased using ionizer 23.

According to the semiconductor cleaning device of the embodiment, since the charge erasing means includes humidifying means 24, charges of foreign matter 2 can be erased using humidifying means 24.

According to the semiconductor cleaning device of the embodiment, since the charge erasing means include heating means 25, charges of foreign matter 2 can be erased using heating means 25.

The embodiments described above can be appropriately combined together.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor cleaning device for removing foreign matter from a semiconductor device comprising:
    an external electrode opposed to a side surface of said semiconductor device;
    a base configured to allow arrangement of said semiconductor device, and having an opening positioned between the side surface of said semiconductor device in the arranged state and said external electrode, and located below the side surface of said semiconductor device;
    a frame having an electrically insulating property, being in contact with said external electrode, arranged on said base and opposed to the side surface of said semiconductor device; and
    suction means connected to said opening in said base and being capable of taking in said foreign matter through said opening.

2. The semiconductor cleaning device according to claim 1, wherein
    said base has electric conductivity.

3. The semiconductor cleaning device according to claim 1, wherein
    said frame includes a projected portion projecting toward the side surface of said semiconductor device.

4. The semiconductor cleaning device according to claim 3, wherein
    said projected portion has a needle-like tip end.

5. The semiconductor cleaning device according to claim 1, wherein
    said frame surrounds the side surface of said semiconductor device.

6. The semiconductor cleaning device according to claim 5, wherein
    said base is configured to allow arrangement of a plurality of semiconductor devices including said semiconductor device; and
    said frame has a grid-like form surrounding each of said plurality of semiconductor devices.

7. The semiconductor cleaning device according to claim 1, wherein
    said external electrode is arranged inside said frame.

8. The semiconductor cleaning device according to claim 1, wherein
said external electrode is arranged inside said base.

9. The semiconductor cleaning device according to claim 1, wherein
said external electrode includes a plurality of external electrode members, and
said external electrode members are arranged to allow application of positive and negative voltages and thus different voltages.

10. The semiconductor cleaning device according to claim 1, wherein
said base includes a groove connected to said opening on the surface carrying said semiconductor device and arranged below the side surface of said semiconductor device.

11. The semiconductor cleaning device according to claim 10, wherein
said base includes an arranging portion formed on the surface carrying said semiconductor device and surrounded by said groove, and
said arranging portion has a slightly smaller area than said semiconductor device.

12. The semiconductor cleaning device according to claim 10, wherein
said groove has an inclined structure formed to reduce its height as the position moves toward said opening.

13. The semiconductor cleaning device according to claim 12, wherein
said frame is formed to change its height according to said inclined structure of said groove.

14. The semiconductor cleaning device according to claim 1, further comprising:
a cap covering a space surrounded by said base and said frame.

15. The semiconductor cleaning device according to claim 14, wherein
said cap has a plurality of through holes continuing to said space.

16. The semiconductor cleaning device according to claim 1, wherein
said suction means includes a rotary fan.

17. The semiconductor cleaning device according to claim 1, wherein
said suction means includes vacuum exhausting means.

18. The semiconductor cleaning device according to claim 1, further comprising:
charge erasing means for erasing charges on said foreign matter adhered to said semiconductor device.

19. The semiconductor cleaning device according to claim 18, wherein
said charge erasing means includes an ionizer.

20. The semiconductor cleaning device according to claim 18, wherein
said charge erasing means includes humidifying means.

21. The semiconductor cleaning device according to claim 18, wherein
said charge erasing means includes heating means.

22. A semiconductor cleaning method comprising the steps of:
arranging said semiconductor device in the semiconductor cleaning device according to claim 1; and
attracting the foreign matter adhered to the side surface of said semiconductor device in the arranged state by said suction means to remove said foreign matter from said semiconductor device.

* * * * *